United States Patent
Ihm

(10) Patent No.: US 9,324,974 B2
(45) Date of Patent: Apr. 26, 2016

(54) LASER INDUCED THERMAL IMAGING APPARATUS AND LASER INDUCED THERMAL IMAGING METHOD USING THE SAME

(71) Applicant: Samsung Display Co., Ltd., Yongin, Gyeonggi-Do (KR)

(72) Inventor: Sam Ho Ihm, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 120 days.

(21) Appl. No.: 14/031,810

(22) Filed: Sep. 19, 2013

(65) Prior Publication Data

US 2014/0332156 A1 Nov. 13, 2014

(30) Foreign Application Priority Data

May 9, 2013 (KR) .......................... 10-2013-0052618

(51) Int. Cl.
*H01L 51/00* (2006.01)
*H01L 51/56* (2006.01)
*B29L 31/34* (2006.01)

(52) U.S. Cl.
CPC ............ *H01L 51/56* (2013.01); *H01L 51/0009* (2013.01); *B29L 2031/3475* (2013.01); *H01L 51/0013* (2013.01)

(58) Field of Classification Search
CPC ...... H01L 51/0013; H01L 51/56; B29C 65/02
USPC ............................................ 156/308.4, 272.8
See application file for complete search history.

(56) References Cited

U.S. PATENT DOCUMENTS

| | | | |
|---|---|---|---|
| 2003/0207500 A1* | 11/2003 | Pichler et al. ................. | 438/127 |
| 2005/0051277 A1* | 3/2005 | Phillips ........................ | 156/540 |
| 2006/0081332 A1 | 4/2006 | Kang et al. | |
| 2006/0132589 A1 | 6/2006 | Kang et al. | |
| 2007/0080637 A1* | 4/2007 | Kasahara et al. ............. | 313/553 |
| 2011/0177746 A1* | 7/2011 | Voronov et al. ................. | 445/25 |
| 2011/0180203 A1 | 7/2011 | Sun et al. | |

FOREIGN PATENT DOCUMENTS

| | | |
|---|---|---|
| KR | 10-2003-0078646 A | 10/2003 |
| KR | 10-2006-0035069 A | 4/2006 |
| KR | 10-2006-0070302 A | 6/2006 |
| KR | 10-2007-0030618 A | 3/2007 |
| KR | 10-2011-0087830 A | 8/2011 |

* cited by examiner

*Primary Examiner* — Scott W Dodds
(74) *Attorney, Agent, or Firm* — Innovation Counsel LLP

(57) ABSTRACT

A laser induced thermal imaging apparatus includes a nozzle part disposed over a donor film in a vacuum chamber so as to be spaced apart from the donor film, and configured to spray an inactive gas onto an upper surface of the donor film. Also included is a shielding layer disposed on the upper surface of the donor film to make contact with the donor film and shaped so as to be positioned along a circumference or outer edge of the donor film.

8 Claims, 7 Drawing Sheets

LASER INDUCED THERMAL IMAGING APPARATUS AND LASER INDUCED THERMAL IMAGING METHOD USING THE SAME

CROSS-REFERENCE TO RELATED APPLICATION

This U.S. non-provisional patent application claims priority under 35 U.S.C. §119 to Korean Patent Application No. 10-2013-0052618, filed on May 9, 2013, the contents of which are hereby incorporated by reference in their entirety.

BACKGROUND

1. Field of Disclosure

The present disclosure relates generally to organic light emitting displays. The present disclosure relates more specifically to a laser induced thermal imaging apparatus and a laser induced thermal imaging method using the same.

2. Description of the Related Art

In recent years, an organic light emitting display has been spotlighted as a next generation display device since it has superior brightness and viewing angle and does not need to include a separate light source as compared to a liquid crystal display. Accordingly, the organic light emitting display has advantages of slimness and light weight. In addition, the organic light emitting display has other desirable properties, e.g., fast response speed, low power consumption, high brightness, etc.

In general, the organic light emitting display includes pixels with an organic light emitting device including an anode electrode, an organic light emitting layer, and a cathode electrode. Holes and electrons are injected into the organic light emitting layer through the anode electrode and the cathode electrode, and are recombined in the organic light emitting layer to generate excitons (electron-hole pairs). The excitons emit energy, which is discharged when an excited state returns to a ground state, as light.

The organic layers are currently formed by a printing method, e.g., an inkjet printing method, a nozzle printing method, etc., or a laser induced thermal imaging method.

The laser induced thermal imaging method has unique advantages of high-resolution patterning, excellent film thickness uniformity, multi-layer stack-ability, and scalability to a large-size mother glass.

The laser induced thermal imaging process using this laser induced thermal imaging method is performed on a donor film and a substrate, and the donor film includes an organic layer, a light-heat conversion layer, and a base film. A laser induced thermal imaging apparatus that performs the laser induced thermal imaging process includes a lamination device to perform a lamination process, and a laser irradiation device to perform a transfer process.

The lamination process is performed by disposing the organic layer to face the substrate, and adhering the donor film to the substrate.

In the transfer process, a laser beam is irradiated onto the base film of the donor film laminated onto the substrate. The laser beam irradiated onto the base film is absorbed by the light-heat conversion layer and converted to heat energy, and the organic layer is transferred to the substrate by this heat energy. As a result, an organic layer pattern is formed on the substrate.

SUMMARY

The present disclosure provides a laser induced thermal imaging apparatus capable of more uniformly laminating a donor film onto a substrate and a lower film.

The present disclosure also provides a laser induced thermal imaging method using the laser induced thermal imaging apparatus.

Embodiments of the inventive concept provide a laser induced thermal imaging apparatus including a nozzle part disposed on a donor film in a vacuum chamber so as to be spaced apart from the donor film. The nozzle is configured to spray an inactive gas onto an upper surface of the donor film. The apparatus also includes a shielding layer disposed on the upper surface of the donor film to make contact with the donor film, where this shielding layer is shaped so as to be positioned along a circumference or outer edge of the donor film. The apparatus also includes a laser.

The laser induced thermal imaging apparatus can further include a heating part disposed on the donor film and provided within an inner edge of the shielding layer along the circumference or outer edge of the donor film.

The donor film can cover a lower film and a substrate disposed on the lower film, and the shielding layer can be disposed on the lower film so that the donor film is positioned between the lower film and the shielding layer.

The shielding layer can extend in a direction substantially perpendicular to the upper surface of the donor film or inclined with respect to the upper surface of the donor film.

The inactive gas can include a nitrogen gas or an argon gas.

The heating part can be disposed on the lower film so that the donor film is positioned between the lower film and the heating part, and the heating part can be provided in a direction substantially perpendicular to the upper surface of the donor film.

The heating part can make contact with the donor film.

Embodiments of the inventive concept provide a laser induced thermal imaging method that includes aligning a shielding layer on a donor film in a vacuum chamber so that the shielding layer contacts an upper surface of the donor film. The method also includes spraying an inactive gas onto the upper surface of the donor film using a nozzle part positioned in the vacuum chamber and spaced apart from the donor film.

The laser induced thermal imaging method can further include aligning a heating part on the donor film along a circumference or outer edge of the donor film, so as to heat-treat the donor film.

According to the above, the donor film may be more uniformly laminated to the substrate and the lower film.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
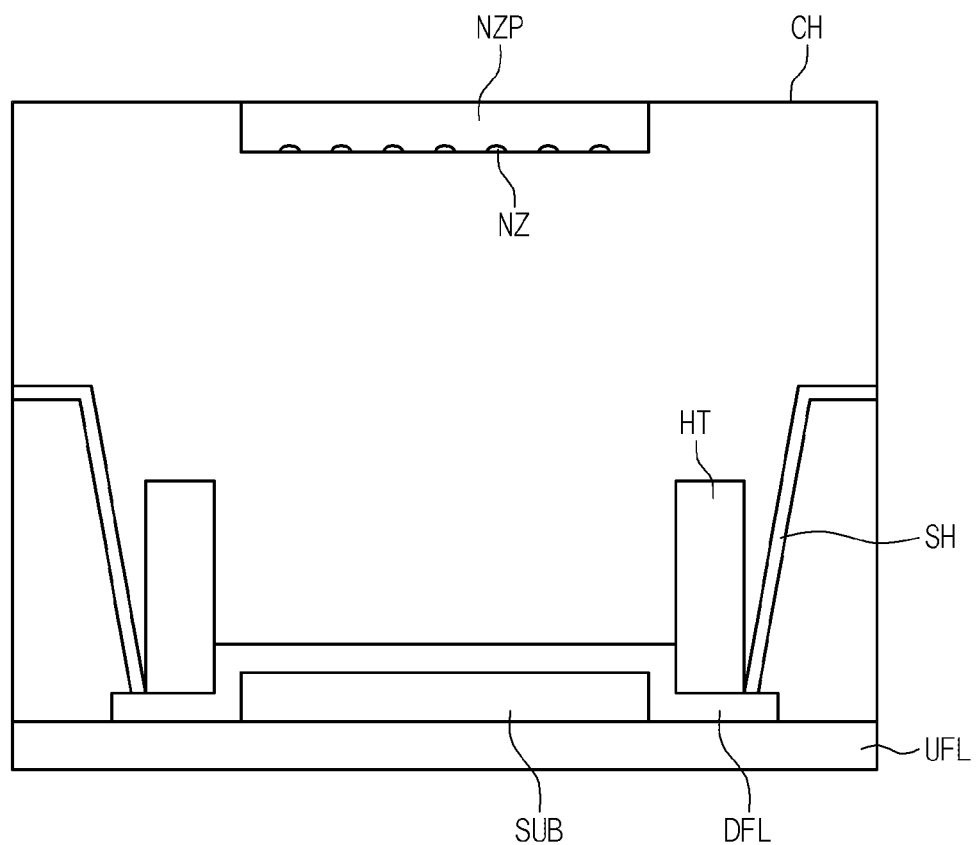
FIG. 1 is a cross-sectional view showing a laser induced thermal imaging apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings, which are not necessarily to scale.

Figure 2:
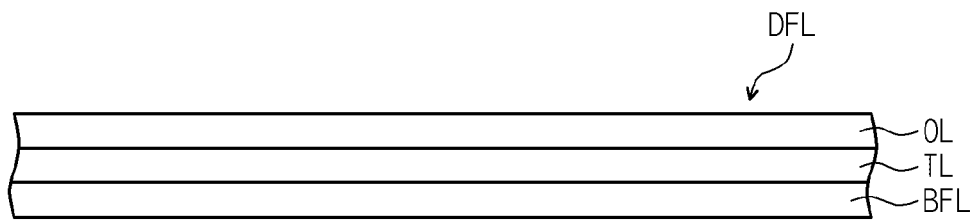
FIG. 2 is a cross-sectional view showing a donor film according to an exemplary embodiment of the present disclosure.
Figure 3:
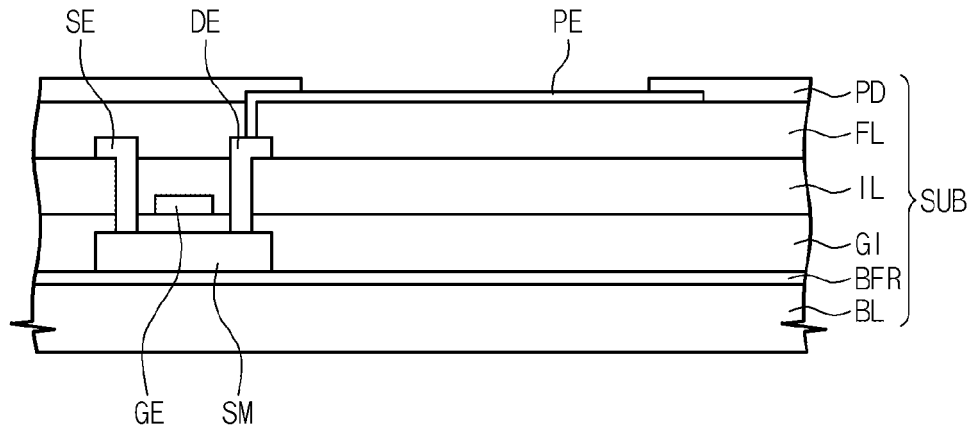
FIG. 3 is a cross-sectional view showing a substrate according to an exemplary embodiment of the present disclosure.
Figure 10:
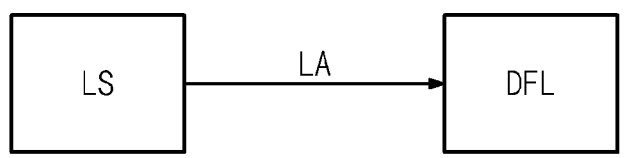
FIG. 10 is a block diagram of a laser induced thermal imaging apparatus according to an exemplary embodiment of the present disclosure.

FIG. 1 is a cross-sectional view showing a laser induced thermal imaging apparatus according to an exemplary embodiment of the present disclosure, FIG. 2 is a cross-sectional view showing a donor film DFL according to an exemplary embodiment of the present disclosure, and FIG. 3 is a cross-sectional view showing a substrate SUB according to an exemplary embodiment of the present disclosure. FIG. 10 is a block diagram of a laser induced thermal imaging apparatus according to an exemplary embodiment of the present disclosure.

Referring to FIGS. 1, 2, and 10, the laser induced thermal imaging apparatus includes a laser LS, a vacuum chamber CH, a nozzle part NZP, a shielding layer SH, and a heating part HT. The nozzle part NZP, the shielding layer SH, and the heating part HT are disposed in the vacuum chamber CH.

The laser induced thermal imaging apparatus is used to laminate the donor film DFL onto the substrate SUB and to transfer a pattern on the donor film DFL onto the substrate SUB. The laser induced thermal imaging apparatus performs a transfer process on the donor film DFL, the substrate SUB disposed under the donor film DFL, and a lower film UFL disposed under the substrate SUB.

Hereinafter, a direction extending from the lower film UFL to the nozzle part NZP (i.e. upward in the view of FIG. 1) is referred to as an upper direction, and a direction extending from the nozzle part NZP to the lower film UFL (i.e. downward in the view of FIG. 1) is referred to as a lower direction.

The lower film UFL is disposed at a lower portion of the vacuum chamber CH. The substrate SUB is disposed on the lower film UFL. When viewed in a plan view, the substrate SUB has an area smaller than an area of the lower film UFL. When the laser induced thermal imaging apparatus is operated, the donor film DFL is laminated onto both the lower film UFL and the substrate SUB. In more detail, the donor film DFL is disposed on the lower film UFL to cover the substrate SUB. Accordingly, a cross-section of the donor film DFL laminated onto the lower film UFL and the substrate SUB has a stair shape, as it conforms to the shape of the substrate SUB. That is, the donor film DFL includes a portion that makes contact with the substrate SUB and a portion that makes contact with the lower film UFL.

Referring to FIG. 2, the donor film DFL includes a base film BFL, a light-heat conversion layer TL disposed on the base film BFL, and an organic layer OL disposed on the light-heat conversion layer TL.

The base film BFL may be framed and formed of a rigid or flexible material. The base film BFL may have a thickness of about 20 micrometers to about 200 micrometers since the base film BFL is difficult to handle when it is too thin and is difficult to transfer when it is too thick.

The light-heat conversion layer TL converts energy from a laser beam irradiated from the laser induced thermal imaging apparatus to heat energy. The heat energy changes (increases) an adhesive force between the organic layer OL and the light-heat conversion layer TL, and thus the organic layer OL transfers onto the substrate SUB.

The organic layer OL may include a plurality of layers that perform different functions. For example, the organic layer OL can include any one or more of an electron injection layer, an electron transporting layer, a light emitting layer, a hole transporting layer, and a hole injection layer, which are sequentially stacked on the light-heat conversion layer TL. In addition, at least one of the electron injection layer, the electron transporting layer, the hole transporting layer, and the hole injection layer may be omitted.

The donor film DFL prevents the organic layer OL from being damaged, and can further include a buffer layer (not shown) disposed between the light-heat conversion layer TL and the organic layer OL to effectively control the adhesive force of the organic layer OL.

The organic layer OL is disposed to face the substrate SUB. Thus, the organic layer OL of the donor film DFL makes contact with the substrate SUB and the lower film UFL.

Referring to FIG. 10, the laser LS irradiates a laser beam on the donor film DFL after the donor film DFL is laminated on the substrate SUB and the lower film UFL.

When the laser induced thermal imaging process is performed after the donor film DFL is laminated on the substrate SUB and the lower film UFL, the organic layer OL is transferred onto the substrate SUB.

Although not shown in the figures, the substrate SUB can include a plurality of pixel areas and a plurality of thin film transistors respectively corresponding to the pixel areas. The pixel areas can include pixel electrodes, where the thin film transistors are connected to the pixel electrodes. For convenience of explanation, only one thin film transistor and only one pixel electrode connected to the thin film transistor have been shown in FIG. 3.

Referring to FIG. 3, the substrate SUB includes a base substrate BL, a buffer layer BFR, a semiconductor layer SM, a gate insulating layer GI, a source electrode SE, a drain electrode DE, a gate electrode GE, an inter-insulating layer IL, a planarization layer FL, a pixel electrode PE, and a pixel definition layer PD, which are each disposed on the base substrate BL.

The buffer layer BFR is disposed on the base substrate BL and prevents impurities from diffusing into the semiconductor layer SM, the source electrode SE, the drain electrode DE, and the gate electrode GE. The buffer layer BFR may include silicon nitride (SiNx), silicon oxide (SiOx), or silicon oxide nitride (SiOxNy), and may be omitted depending on a material of the base substrate BL and a process condition.

The semiconductor layer SM is disposed on the buffer layer BFR, and is formed of an inorganic semiconductor material or an organic semiconductor material. For instance, the semiconductor layer SM may include an oxide semiconductor material, an amorphous silicon semiconductor material, and/or a crystalline or polycrystalline silicon semiconductor material. The oxide semiconductor material can include an oxide material containing at least one of indium (In), gallium (Ga), zinc (Zn), and tin (Sn). For instance, the semiconductor layer SM can include an oxide semiconductor material, e.g., zinc oxide, tin oxide, indium oxide, indium-zinc oxide (In—Zn), indium-tin (In—Sn) oxide, indium-gallium-zinc (In—Ga—Zn) oxide, indium-zinc-tin (In—Zn—Sn) oxide, indium-gallium-zinc-tin (In—Ga—Zn—Sn) oxide, or the like. A source area and a drain area of the semiconductor layer SM may be doped with an n-type impurity or a p-type impurity.

The gate insulating layer GI is disposed on the semiconductor layer SM.

The source electrode SE and the drain electrode DE are disposed on the semiconductor layer SM, and the gate electrode GE is disposed on the gate insulating layer GI.

The inter-insulating layer IL is disposed on the gate insulating layer GI to cover the gate electrode GE, and the planarization layer FL is disposed on the inter-insulating layer IL to cover the source electrode SE and the drain electrode DE. Although not shown in the figures, a color filter (not shown) may be disposed on the planarization layer FL in known manner.

The pixel electrode PE is disposed on the planarization layer FL. The pixel electrode PE is partially exposed through the pixel definition layer PD, and the organic layer OL is transferred onto the exposed portion of the pixel electrode PE after the donor film DFL is laminated thereon.

The donor film DFL is laminated onto the substrate SUB and the lower film UFL such that the pixel electrode PE and the organic layer OL face each other. Then, when the laser induced thermal imaging process is performed, the organic layer OL is transferred onto the pixel electrode PE of the substrate SUB.

The nozzle part NZP is disposed over the donor film DFL to face the donor film DFL, where the nozzle part NZP includes a plurality of nozzles NZ. Each of the nozzles then sprays an inactive gas. In this manner, the inactive gas is delivered to an upper surface of the donor film DFL. The inactive gas provided from the nozzles NZ may be, for example, nitrogen ($N_2$) gas or argon (Ar) gas. The upper surface of the donor film DFL is pressurized by the inactive gas supplied to the upper surface of the donor film DFL. Therefore, the donor film DFL may be adhered to the substrate SUB. That is, pressure from the stream of gas helps bond the lower surface of donor film DFL to the upper surface of substrate SUB. As a result, a delamination between the donor film DFL and the substrate SUB may be prevented.

The shielding layer SH is disposed on the donor film DFL to make contact with the donor film DFL. The shielding layer SH is provided along a circumference (i.e., along the outer edge) of the donor film DFL. As used herein, the term "circumference" refers broadly to an edge of an object of any shape, rather than only to the outer edge of a circle. Thus, the shielding layer SH is shaped so that its inner edge (the edge contacting donor film DFL) lies along and proximate to the entire outer edge of donor film DFL. The shielding layer SH is disposed on the upper surface of the donor film DFL, which directly makes contact with the lower film UFL.

The shielding layer SH is extended in a direction substantially vertical to the upper surface of the donor film DFL, and is bent at an upper portion thereof to make contact with an inner wall of the vacuum chamber, but it should not be limited thereto or thereby. That is, the shielding layer SH may be inclined with respect to the upper surface of the donor film DFL and bent at the upper portion thereof, to make contact with the inner wall of the vacuum chamber. The shielding layer SH prevents the inactive gas provided from the nozzle part NZP from infiltrating into other areas rather than the upper surface of the donor film DFL. That is, the shielding layer SH helps direct gas from the nozzle part NZP onto the donor film DFL.

The heating part HT is disposed on the donor film DFL along the circumference of the donor film DFL to be placed inside the shielding layer SH. That is, a distance between the heating part HT and the substrate SUB is smaller than a distance between the shielding layer SH and the substrate SUB.

The heating part HT is disposed on the upper surface of the donor film DFL, which directly makes contact with the lower film UFL, and makes contact with the donor film DFL.

The shielding layer SH prevents the inactive gas provided from the nozzle part NZP from infiltrating into other areas rather than the upper surface of the donor film DFL. Thus, the inactive gas only pressurizes the upper surface of the donor film DFL. As a result, delamination of the donor film DFL from the substrate SUB may be prevented, and the donor film DFL may be more uniformly laminated onto the substrate SUB. In addition, the donor film DFL may be more uniformly laminated onto the lower film UFL.

Hereinafter, the laser induced thermal imaging method according to the present exemplary embodiment of the present disclosure will be described. For convenience of explanation, the lamination method will be mainly described, and detailed descriptions of the manufacture of the substrate SUB and its transfer onto lower film UFL will be omitted.

Figure 4:
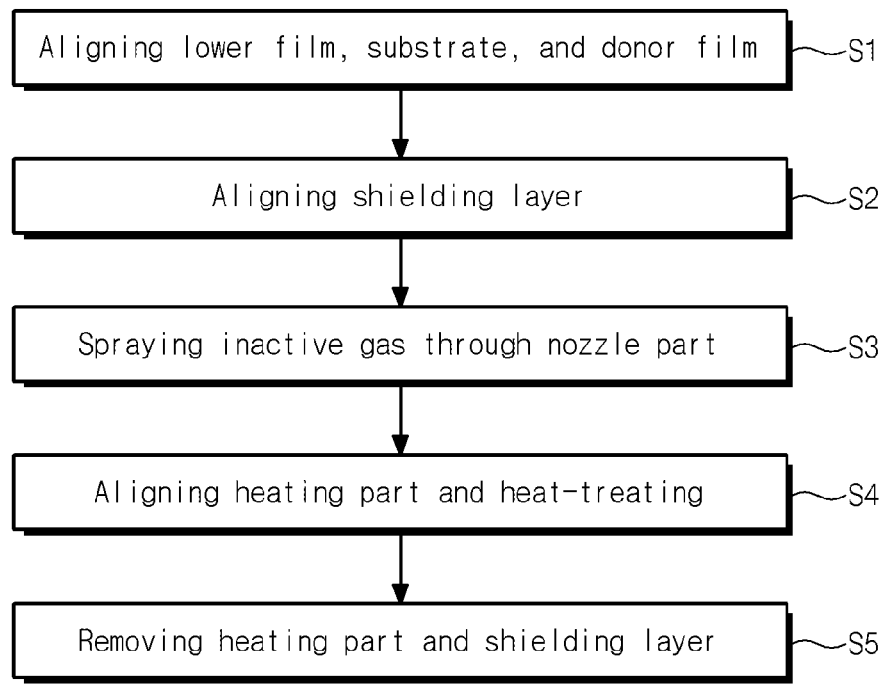
FIG. 4 is a flowchart showing a laser induced thermal imaging method according to an exemplary embodiment of the present disclosure.

FIG. 4 is a flowchart showing the laser induced thermal imaging method according to an exemplary embodiment of the present disclosure, and FIGS. 5 to 9 are cross-sectional views explaining the laser induced thermal imaging method according to an exemplary embodiment of the present disclosure. In FIGS. 5 to 9, the same reference numerals denote the same elements in FIGS. 1 to 3, and thus detailed descriptions of the same elements will be omitted.

Referring to FIG. 4, the laser induced thermal imaging method includes aligning the lower film, the substrate, and the donor film properly within vacuum chamber CH (S1), aligning the shielding layer and making the shielding layer contact the donor film (S2), spraying the inactive gas through the nozzle part to push the donor film down onto the substrate (S3), aligning the heating part and performing a heat treatment process (S4), and removing the heating part and the shielding layer (S5).

Figure 5:
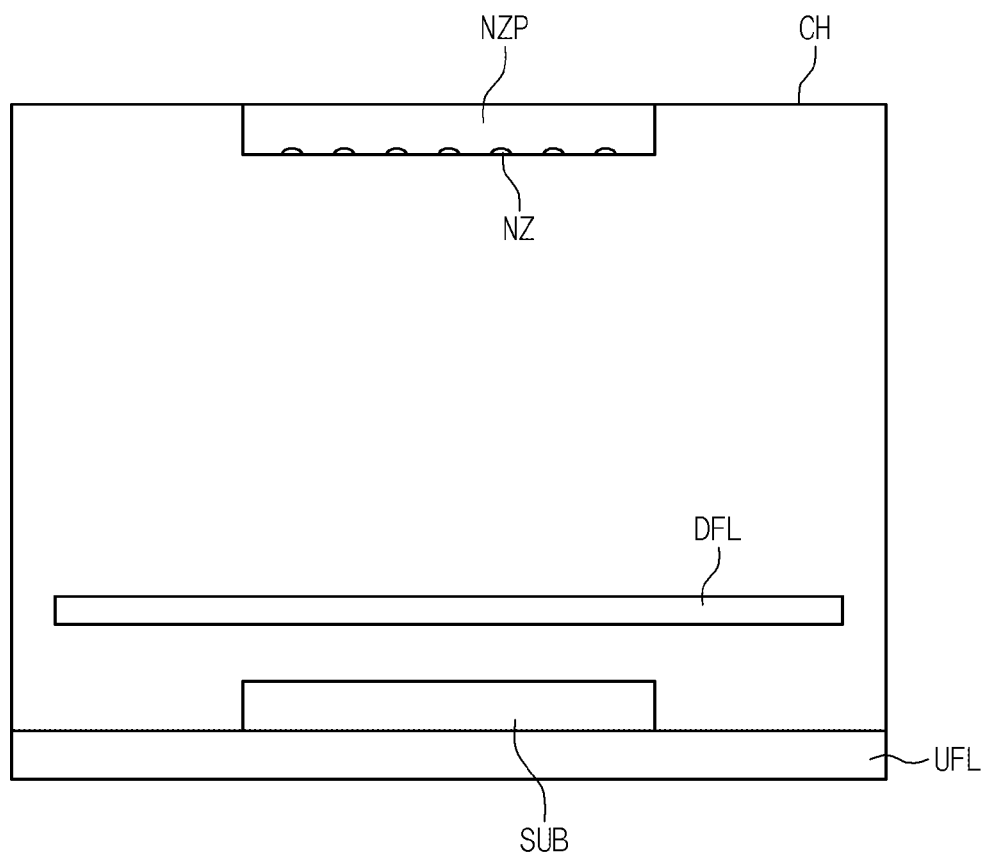
FIGS. 5 to 9 are cross-sectional views explaining a laser induced thermal imaging method according to an exemplary embodiment of the present disclosure.

Referring to FIG. 5, in the step S1, the donor film DFL is aligned on the substrate SUB and the lower film UFL while a vacuum is maintained in the vacuum chamber CH. In this case, the donor film DFL is disposed to be upwardly spaced apart from the substrate SUB and the lower film UFL at a predetermined distance.

The donor film DFL is aligned with the substrate SUB and the lower film UFL in consideration that the organic layer OL of the donor film DFL is transferred to specific areas of the substrate SUB, i.e., the pixel electrodes PE. In addition, the donor film DFL is aligned to cover the substrate SUB and a portion of the lower film UFL disposed adjacent to the substrate SUB. Thus, when the donor film DFL is laminated to the substrate SUB and the lower film UFL after the donor film DFL is properly aligned with the substrate SUB and the lower film UFL, the donor film DFL has a stair shape when viewed in a cross-section, conforming to the step difference in height between the substrate SUB and lower film UFL.

The lower film UFL supports the substrate SUB and a portion of the donor film DFL covers a portion of the lower film UFL.

The substrate SUB may be used as the substrate SUB of an organic light emitting display device shown in FIG. 3.

Figure 6:
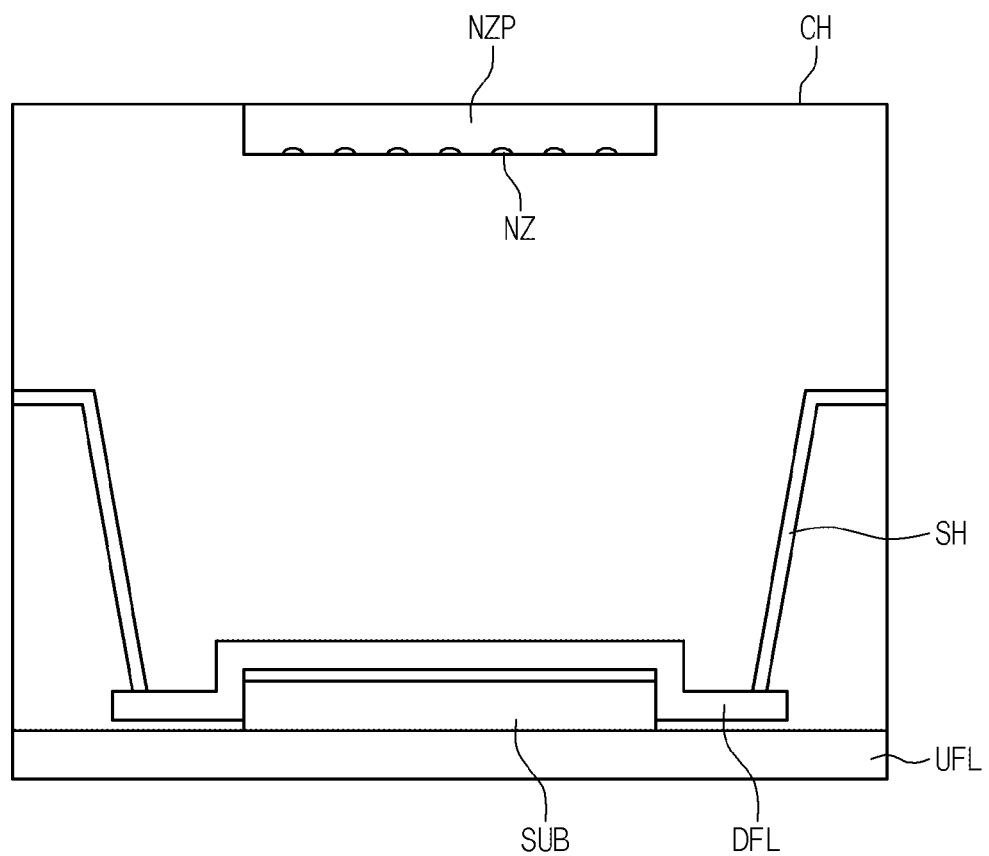

Referring to FIG. 6, in the step S2, the shielding layer SH is aligned with the donor film DFL and then made to contact the donor film DFL. In addition, the shielding layer SH is bent at a predetermined angle to make contact with the inner wall of the vacuum chamber, as can be seen by the upper portion of layer SH in FIG. 6. In this case, since the shielding layer SH does not press the donor film DFL against the lower film UFL, the donor film DFL is not completely adhered to the lower film UFL but is instead partially separated therefrom.

The shielding layer SH shields the upper portion of the donor film DFL to prevent a "critical mass" of the inactive gas from infiltrating into other areas besides the upper portion of the donor film DFL when the inactive gas is sprayed through the nozzle part NZP.

Here, the term "critical mass" means the minimum amount of the inactive gas supplied between the lower film UFL and the donor film DFL or between the substrate SUB and the lower film UFL to cause separation between the lower film UFL and the donor film DFL or between the lower film UFL and the substrate SUB. When a critical mass or more of the inactive gas is leaked to these areas rather than the upper portion of the donor film DFL, bubbles are generated between the substrate SUB and the donor film DFL, between the substrate SUB and the lower film UFL, or between the lower film UFL and the substrate SUB. As a result, a transfer defect may be created in the organic layer OL.

The critical mass is determined depending on the lower film UFL, the substrate SUB, and the donor film DFL.

The shielding layer SH may take on any shape that prevents the inactive gas from leaking into the above-described undesirable areas in amounts equal to or greater than the critical mass. As an example, the shielding layer SH can include a first member having a rectangular frame shaped to be positioned around the circumference of the donor film DFL and to extend upward, and a second member connected to the first member and extending from an upper boundary of the rectangular frame shape to the vacuum chamber.

Figure 7:
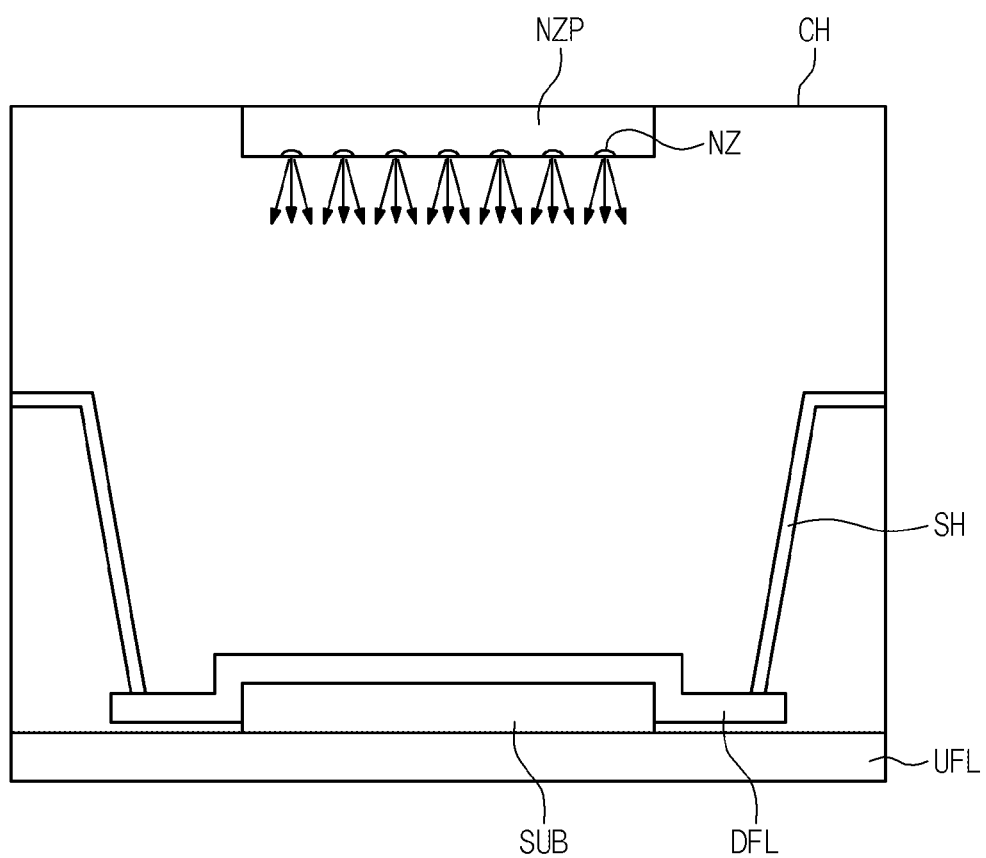

Referring to FIG. 7, in the step S3, the inactive gas is sprayed from the nozzle part NZP toward the upper portion of the donor film DFL.

The nozzle part NZP includes the nozzles NZ, and the inactive gas is sprayed toward the upper portion of the donor film DFL from each of the nozzles NZ. The inactive gas sprayed from the nozzles NZ may be, for example, the nitrogen ($N_2$) gas or the argon (Ar) gas. Since the gas sprayed from the nozzles NZ is an inactive gas, the donor film DFL may not react with the gas. When the donor film DFL reacts with the gas, the donor film DFL is damaged, producing transfer defects.

The upper portion of the donor film DFL is in the vacuum state before the inactive gas is sprayed, and the inactive gas is sprayed to the upper portion of the donor film DFL from the nozzles NZ to pressurize the upper portion of the donor film DFL.

Figure 8:
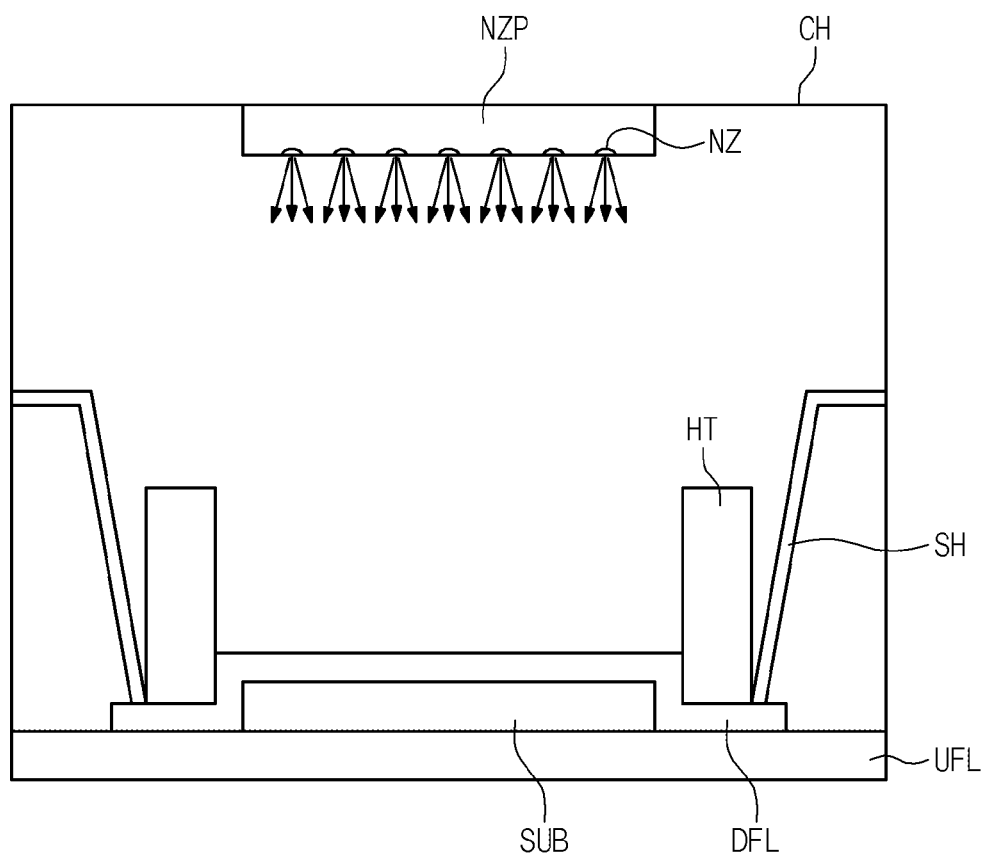

The donor film DFL is laminated to the substrate SUB while the inactive gas pressurizes the upper portion of the donor film DFL. Referring to FIG. 8, in the step S4, the heating part HT is aligned to the upper surface of the donor film DFL disposed directly on the lower film UFL, and the donor film DFL is heat treated. The heating part HT is disposed on the donor film DFL along the circumference of the donor film DFL and inside (within the inner circumference or edge of) the shielding layer SH. That is, the distance between the heating part HT and the substrate SUB is smaller than the distance between the shielding layer SH and the substrate SUB.

The heating part HT is disposed on the upper surface of part of the donor film DFL which directly makes contact with the lower film UFL. The heating part HT also makes contact with the donor film DFL.

The heating part HT may have a rectangular frame shape formed to correspond to the circumference of the donor film DFL. Although not shown in the figures, the heating part HT can include four bars connected to each other to form the rectangular shape when viewed in a plan view, and then the heating part HT is disposed on the donor film DFL. In addition, although not shown in figures, the heating part HT may include a heating cable to heat-treat the donor film DFL.

When the upper surface of the donor film DFL is heat-treated using the heating part HT, the donor film DFL is laminated to the lower film UFL.

Figure 9:
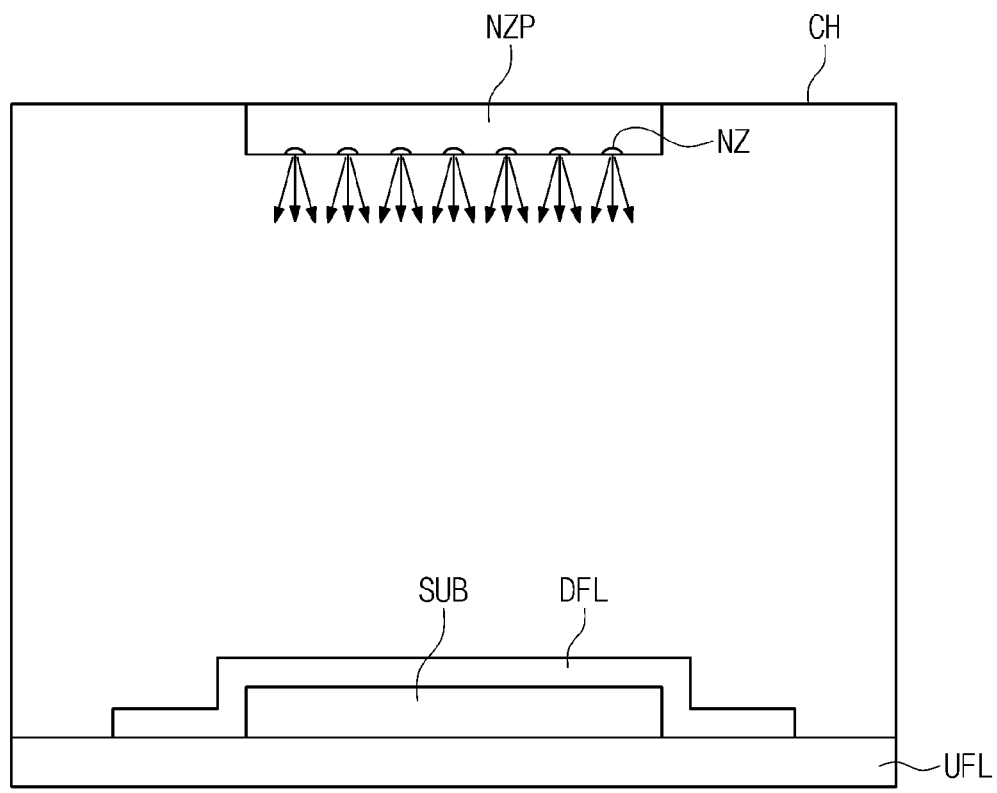

Referring to FIG. 9, in the step S5, the heating part HT and the shielding layer SH are removed from the donor film DFL. Accordingly, the lamination process of adhering the donor film DFL to the substrate SUB and the lower film UFL is completed.

According to the laser induced thermal imaging method, the donor film DFL is uniformly laminated to the substrate SUB and the lower film UFL, so that separation between the donor film DFL and the substrate SUB may be prevented.

Different from the above-described method, when gas pressure is applied to the upper surface of the donor film DFL after the donor film DFL is laminated to the lower film UFL by heat-treating the upper surface of the donor film DFL onto the lower film UFL, separation can occur between the donor film DFL and the substrate SUB or the substrate SUB may be imprinted on the donor film DFL.

This is because a donor film DFL which is partially separated from the substrate SUB, or partially squashed by a wrinkle formed on the donor film DFL, is laminated onto the substrate SUB when the donor film DFL is laminated to the lower film UFL. When assuming that the pressure caused by the inactive gas is uniformly applied to the entire surface of the upper portion of the donor film DFL while the donor film DFL is partially separated from the substrate or partially squashed, the donor film DFL is only partially laminated onto the substrate SUB, and is not completely adhered to the substrate SUB.

This is made worse by the fact that the donor film DFL is securely adhered to the lower film UFL before the donor film DFL is laminated to the substrate SUB. This is because the separated or imprinted area between the donor film DFL and the substrate SUB is difficult to be squeezed out of the substrate SUB after the donor film DFL is securely adhered to the lower film UFL.

Therefore, it is preferred that the donor film DFL be laminated to the lower film UFL after the donor film DFL is laminated to the substrate SUB. In addition, when the shielding layer SH is provided on the upper surface of the donor film DFL, a critical mass of the inactive gas equal may be prevented from infiltrating between the donor film DFL and the lower film UFL while the donor film DFL is laminated to the substrate SUB.

In this case, although the donor film DFL is partially separated from the substrate or partially squashed, areas of separation of the donor film DFL may be squeezed out when the inactive gas pressurizes the upper portion of the donor film DFL. Thus, the donor film DFL may be more uniformly laminated to the substrate SUB without separated or imprinted areas between the donor film DFL and the substrate SUB.

In addition, since the shielding layer SH prevents the inactive gas from infiltrating between the donor film DFL and the lower film UFL, the donor film DFL may be uniformly laminated to the substrate SUB without separated or imprinted areas between the donor film DFL and the substrate SUB.

Consequently, the donor film may be uniformly laminated onto the substrate and the lower film according to the laser induced thermal imaging apparatus and the laser induced thermal imaging method using the laser induced thermal imaging apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A laser induced thermal imaging-apparatus, comprising:
   a laser;
   a nozzle part disposed over a donor film in a vacuum chamber so as to be spaced apart from the donor film, the nozzle configured to spray an inactive gas onto an upper surface of the donor film;
   a shielding layer disposed on the upper surface of the donor film to make contact with the donor film, the shielding layer being shaped so as to be positioned along an outer edge of the donor film; and
   a heating part disposed on the donor film and provided within an inner edge of the shielding layer along the outer edge of the donor film.

2. The apparatus of claim 1, wherein the donor film covers a lower film and a substrate is disposed on the lower film.

3. The apparatus of claim 2, wherein the shielding layer is disposed on the lower film so that the donor film is positioned between the lower film and the shielding layer.

4. The apparatus of claim 3, wherein the shielding layer is extended in a direction substantially perpendicular to the upper surface of the donor film or inclined with respect to the upper surface of the donor film.

5. The apparatus of claim 4, wherein the inactive gas comprises a nitrogen gas or an argon gas.

6. The apparatus of claim 5, wherein the heating part is disposed on the lower film so that the donor film is positioned between the lower film and the heating part.

7. The apparatus of claim 6, wherein the heating part extends in a direction substantially perpendicular to the upper surface of the donor film.

8. The apparatus of claim 7, wherein the heating part makes contact with the donor film.

\* \* \* \* \*